(12) United States Patent
Liao et al.

(10) Patent No.: US 7,851,328 B2
(45) Date of Patent: Dec. 14, 2010

(54) STI STRESS MODULATION WITH ADDITIONAL IMPLANTATION AND NATURAL PAD SIN MASK

(75) Inventors: Ming-Han Liao, Taipei (TW); Tze-Liang Lee, Hsinchu (TW); Ling-Yen Yeh, Hsinchu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 12/235,329

(22) Filed: Sep. 22, 2008

(65) Prior Publication Data

US 2010/0075480 A1      Mar. 25, 2010

(51) Int. Cl.
*H01L 21/76* (2006.01)
(52) U.S. Cl. .................. 438/433; 438/435; 438/400; 438/424; 257/E21.54
(58) Field of Classification Search .............. 257/118, 257/244, 328–333, 466, 513, 594; 438/242, 438/268–274, 435
See application file for complete search history.

(56) References Cited

U.S. PATENT DOCUMENTS

2006/0180868 A1* 8/2006 Maciejewski et al. ....... 257/369
2007/0012960 A1   1/2007 Knoefler et al.
2009/0053874 A1* 2/2009 Dubois et al. ............... 438/433

OTHER PUBLICATIONS

Yiming Li et al., "Strained CMOS Device With Shallow-Trench-Isolation Stress Buffer Layers", IEEE Transactions on Electron Devices, vol. 55, No. 4, Apr. 2008, 0018-9383, pp. 1085-1089.
Masafuni Miyamoto et al., "Impact of Reducing STI-Induced Stress on Layout Dependence of MOSFET Characteristics", IEEE Transactions on Electron Devices, Vole 51, No. 3, Mar. 2004, 0018-9393/04, pp. 440-443.

* cited by examiner

*Primary Examiner*—N Drew Richards
*Assistant Examiner*—Mamadou Diallo
(74) *Attorney, Agent, or Firm*—Haynes and Boone, LLP

(57) ABSTRACT

A method of manufacturing a semiconductor structure is provided. The method includes forming a hard mask pattern on a semiconductor substrate, wherein the hard mask pattern covers active regions; forming a trench in the semiconductor substrate within an opening defined by the hard mask pattern; filling the trench with a dielectric material, resulting in a trench isolation feature; performing an ion implantation to the trench isolation feature using the hard mask pattern to protect active regions of the semiconductor substrate; and removing the hard mask pattern after the performing of the ion implantation.

21 Claims, 4 Drawing Sheets

STI STRESS MODULATION WITH ADDITIONAL IMPLANTATION AND NATURAL PAD SIN MASK

BACKGROUND

An integrated circuit (IC) is formed by creating one or more devices (e.g., circuit components) on a semiconductor substrate. Each device is separated from the other devices using an isolation feature such as a shallow trench isolation (STI) structure. Current STI structures often include silicon oxide such as high density plasma chemical vapor deposition (HDPCVD) silicon oxide or silicon oxide by a high aspect ratio process (HARP silicon oxide). However, high stress may be induced by those STI structures, such as a compressive stress in the active region of the silicon substrate after an annealing process. The compressive stress can degrade the electron mobility of the silicon substrate in the active regions. In addition, the saturation current in an n-metal-oxide-silicon field-effect-transistor (nMOSFET) can be decreased thereby. Furthermore, the high stress may cause a leakage current that affects the performance of the resulting device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
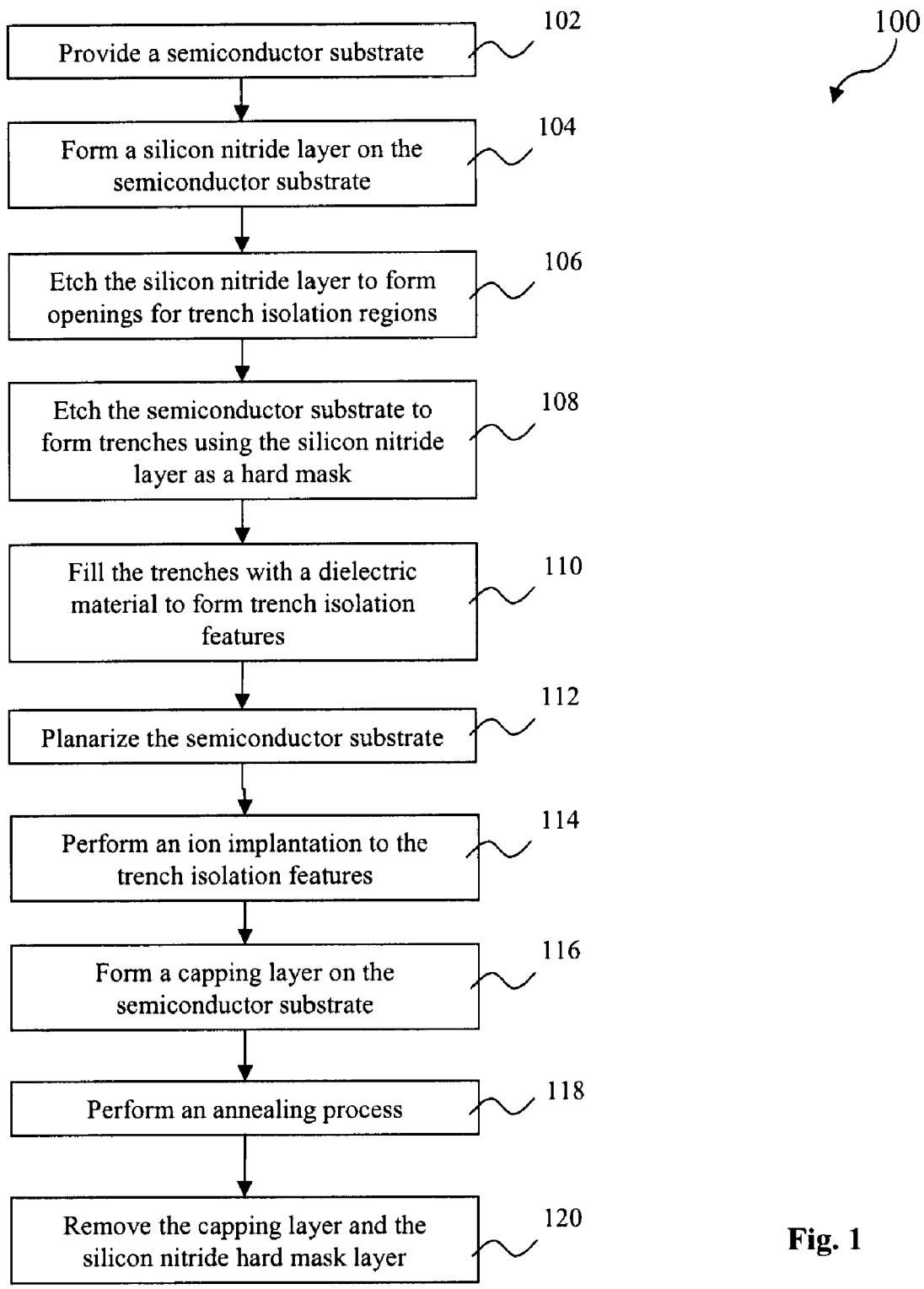
FIG. 1 is a flowchart of a method for making an integrated circuit constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 making an integrated circuit. FIGS. 2, 3b and 4-6 are sectional views of at least a portion of a semiconductor structure 200 during various manufacturing stages. FIG. 3a is a sectional view of at least a portion of the semiconductor structure during a manufacturing stage in another embodiment. The method 100 and the semiconductor structure 200 are collectively described with reference to FIG. 1 through FIG. 6.

Figure 2:
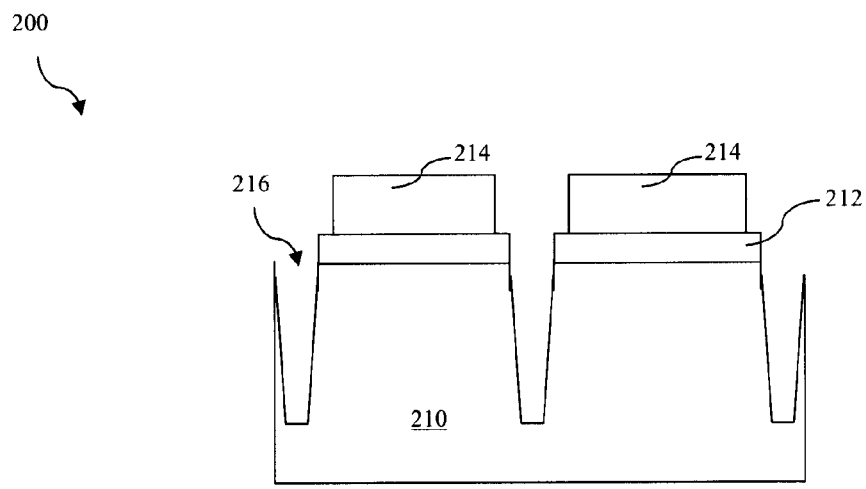
FIGS. 2, 3b and 4-6 are sectional views of one embodiment of at least a portion of a semiconductor structure during various manufacturing stages constructed according to aspects of the present disclosure.
Figure 3A:
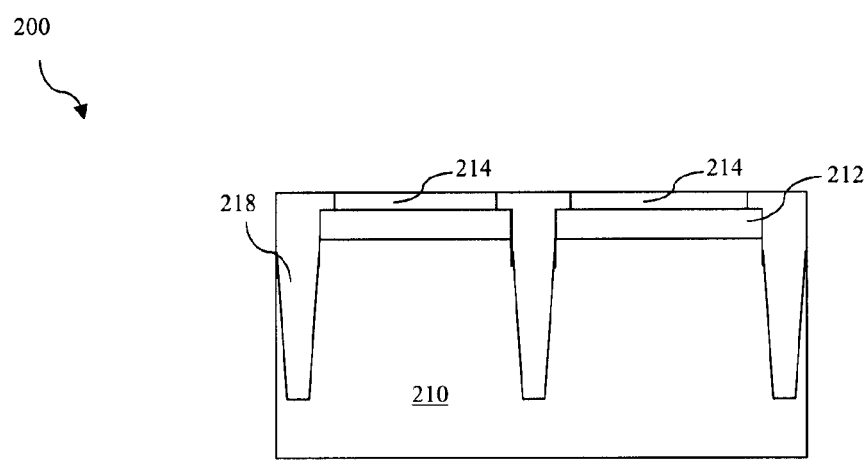
FIG. 3a is a sectional view of another embodiment of at least a portion of a semiconductor structure during a manufacturing stage constructed according to aspects of the present disclosure.

Referring to FIGS. 1 and 2, the method 100 begins at step 102 by providing a semiconductor substrate 210. The semiconductor substrate 210 includes silicon. Alternatively, the substrate 210 include germanium or silicon germanium. In other embodiments, the substrate 210 may use another semiconductor material, such as diamond, silicon carbide, gallium arsenic, GaAsP, AlInAs, AlGaAs, GaInP, or other proper combination thereof. Furthermore, the semiconductor substrate may be a bulk semiconductor such as bulk silicon. The bulk silicon may further include an epitaxy silicon layer.

In other examples, a dielectric material layer may be incorporated into the semiconductor substrate 210 and present underlying well structures of the semiconductor substrate for proper isolation effect. In one embodiment, the dielectric insulator layer includes a buried oxide (BOX) layer, such as that formed by a method referred to as separation by implantation of oxygen (SIMOX) technology, or wafer bonding. In another embodiment, the dielectric material layer may also be formed on the substrate by thermal oxidation, atomic layer deposition (ALD), chemical vapor deposition (CVD), physical vapor deposition (PVD), and/or other processes. Chemical mechanical polishing (CMP) and/or other methods may be employed to attain a desired thickness of the insulator layer. Moreover, although not limited by the scope of the present disclosure, the insulator layer may include oxide, silicon oxide, silicon nitride, silicon oxynitride, low k materials, air gap, combinations thereof, and/or other materials.

Still referring to FIGS. 1 and 2, the method 100 proceeds to step 104 by forming a hard mask layer on the semiconductor substrate 210. In one embodiment, a pad silicon oxide layer 212 is formed on the silicon substrate 210. The pad silicon oxide layer 212 is formed by a thermal oxidation process. In one example, the pad silicon oxide layer 212 has a thickness about 90 angstroms. In another example, the pad silicon oxide 212 may have a thickness ranging between about 50 angstroms and about 200 angstroms. Then, a silicon nitride layer 214 is formed on the pad silicon oxide layer 212. The silicon nitride layer 214 can be formed by a low pressure chemical vapor deposition (LPCVD) process. For example, the precursor including dichlorosilane (DCS or $SiH_2Cl_2$), bis(tertiary-butylamino)silane (BTBAS or $C_8H_{22}N_2Si$), and disilane (DS or $Si_2H_6$) is used in the CVD process to form the silicon nitride layer 214. In one example, the silicon nitride layer 214 has a thickness of about 800 angstroms. In another example, the silicon nitride layer 214 may have a thickness ranging between about 400 angstroms and about 1500 angstroms. The silicon nitride layer is used as the hard mask for subsequent etching and implanting processes. Alternatively, other dielectric material may be used as the hard mask. For example, silicon oxynitride may be formed as the hard mask.

Still referring to FIGS. 1 and 2, the method 100 proceeds to step 106 by etching the hard mask layer to form one or more openings defining isolation regions on the semiconductor substrate 210. A photolithography process and an etching process are used to pattern the hard mask layer such as the silicon nitride layer 214. An exemplary photolithography process may include photoresist patterning, etching, and photoresist stripping. The photoresist patterning may further include processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process. In one example, a dry etching process used to etch the silicon nitride includes a chemistry including fluorine-containing gas. In furtherance of the example, the chemistry of the dry etch includes $CF_4$, $SF_6$, or $NF_3$. As another example of the wet etching process to the silicon nitride layer, the etchant includes a phosphoric acid ($H_3PO_4$) solution. In another example, a hydrofluoric acid (HF) or buffered HF may be used to etch the silicon dioxide layer 212 to expose the semiconductor substrate 210 within the openings defined by the silicon nitride layer 214.

Still referring to FIGS. 1 and 2, the method 100 proceeds to step 108 by etching the semiconductor substrate such as the silicon substrate using the patterned silicon nitride 214 as a hard mask, to form one or more trenches 216 in the substrate, as illustrated in the FIG. 2. In one example, the trenches 216 may have a thickness of about 0.25 microns for isolation purposes. In another example, the trenches 216 may have a thickness less than about 1 micron. In one embodiment, a dry etching process is used to etch the substrate and form the trenches. For example, implemented is a dry etching process with a chlorine based etching chemical to form the trenches. In another example, the dry etching process includes fluorine-containing gas, such as $CF_4$, $SF_6$, or $NF_3$. Additionally, a wet etching process may be further applied to form the trenches with a proper profile. For example, a potassium hydroxide (KOH) solution may be applied to further etch the silicon substrate after the trench dry etching process.

Figure 3B:
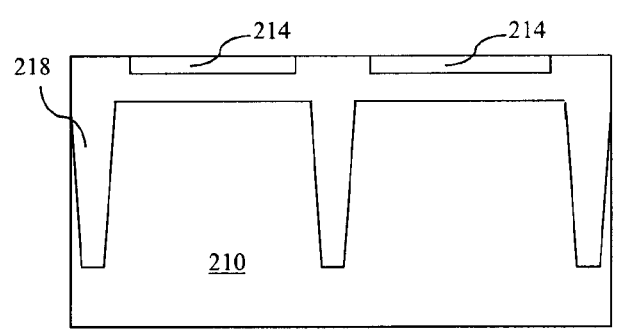

Referring to FIGS. 1 and 3a, the method 100 proceeds to step 110 by filling the trenches with a dielectric material to form trench isolation features 218, referred to as shallow trench isolation (STI) as well. The trench isolation features 218 include silicon oxide. The silicon oxide can be filled in the trenches by a CVD process. In various examples, the silicon oxide can be formed by a high density plasma chemical vapor deposition (HDPCVD). The silicon oxide may be alternatively formed by a high aspect ratio process (HARP). In another embodiment, the trench isolation features 218 may include a multi-layer structure. In furtherance of the embodiment, the trench isolation features 218 include other suitable materials, such as silicon nitride, silicon oxynitride, low k materials, air gap, or combinations thereof, to form the trench isolation features. For example, the trench isolation features 218 include a thermal oxide lining layer to improve the trench interface. In another example, the trenches are filled with a thermal silicon oxide lining layer and a HDPCVD silicon oxide layer. In another example, the trenches may have a multi-layer structure with a thermal oxide liner layer, a CVD silicon nitride layer, and a CVD silicon oxide layer. As one example illustrated in FIG. 3b, since the pad silicon oxide 212 and trench isolation features 218 both include silicon oxide material, the pad silicon oxide 212 and trench isolation features are collectively labeled by a numeral 218. The trench isolation features of FIG. 3b are continuously used as an example, for simplicity, in the subsequent processing steps associated with FIGS. 4-6.

The trench-filling dielectric material can be additionally formed on the silicon nitride layer 214 while it fills in the trenches 216. Still referring to FIGS. 1 and 3a/3b, the method 100 proceeds to step 112 by planarizing the semiconductor substrate after the trenches are filled with one or more dielectric materials. In one embodiment, a chemical mechanical polishing (CMP) process is applied to the semiconductor substrate to remove excessive portions of the trench-filling dielectric material and to form a global planarized surface. As one example, the CMP process can use the silicon nitride layer 214 as a polishing stop layer so that the CMP process can properly stop at the silicon nitride layer 214. Other process may be used to achieve the similar polishing effect. For example, an etch-back process may be used to remove the excessive trench-filling dielectric material and form a global planarized surface. The method 100 may include an annealing process applied to the trench isolation features 218 in the semiconductor substrate. The annealing process uses an annealing temperature ranging between about 800° C. and about 1100° C. In one example, the annealing process may be implemented before the CMP process. Alternatively or additionally, the annealing process may be implemented after the CMP process.

Figure 4:
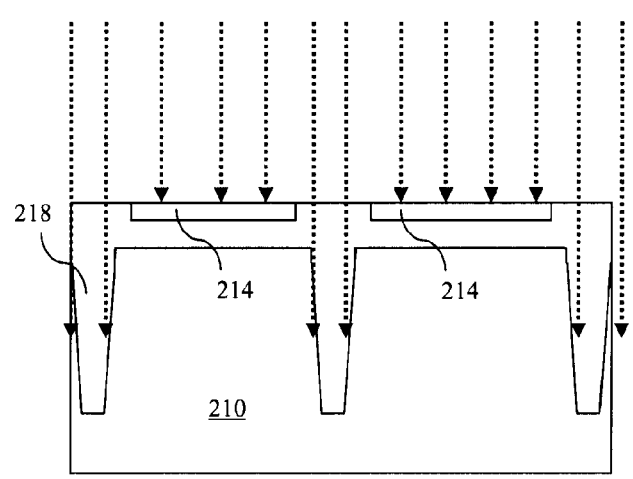

Referring to FIGS. 1 and 4, the method 100 proceeds to step 114 by performing an ion implantation process to the trench isolation features 218 to release the stress built in the active regions of the semiconductor substrate. The stress of the active region is caused by the trench isolation features during the formation of the trench isolation features. During the ion implantation process, the silicon nitride layer 214 is used as a hard mask to protect the active regions in the semiconductor substrate 210 from damage or contamination. In one embodiment, the dopant used in the ion implantation includes silicon (Si). In another embodiment, the dopant used in the ion implantation includes germanium (Ge). In another embodiment, the dopant used in the ion implantation includes nitrogen (N). In other various embodiments, the dopant used in the ion implantation may include Si, Ge, N, argon (Ar), fluorine (F), arsenic (As), or combinations thereof. The dopant concentration implanted in the trench isolation features ranges between about $10^{14}$ $cm^{-2}$ and about $10^{15}$ $cm^{-2}$, depending on the dopant type and the stress of the active region. In one embodiment, the ion implanting energy is tuned such that the dopant can be substantially implanted in the trench isolation features. For example, the dopant is distributed in a portion of or a full span of the trench isolation features in vertical direction. In one example, the ion implantation process utilizes silicon implantation with an implanting energy ranging between about 30 keV and about 80 keV and a doping concentration ranging between about $10^{14}$ $cm^{-2}$ and about $10^{15}$ $cm^{-2}$. Particularly, the silicon implantation may have an implanting energy of about 70 keV and a doping concentration of about $10^{15}$ $cm^{-2}$. In another example, a germanium implantation is implemented with an implanting energy of about 30 keV and a doping concentration of about $10^{14}$ $cm^{-2}$. In another example, an argon implantation is implemented with an implanting energy of about 70 keV and a doping concentration of about $10^{14}$ $cm^{-2}$. In another example, a nitrogen implantation is implemented with an implanting energy of about 45 keV and a doping concentration of about $10^{15}$ $cm^{-2}$. During the ion implantation at this step, the silicon nitride is used as a natural hard mask self-aligned with the active regions such that the active regions of the semiconductor substrate are protected from the ion implantation and the damage thereof. As mentioned above, other suitable dielectric materials may be used as a hard mask for trench etching and the ion implantation. After the ion implantation at this step, the stress, such as compressive stress, built in the active regions of the semiconductor substrate can be substantially released.

Figure 5:
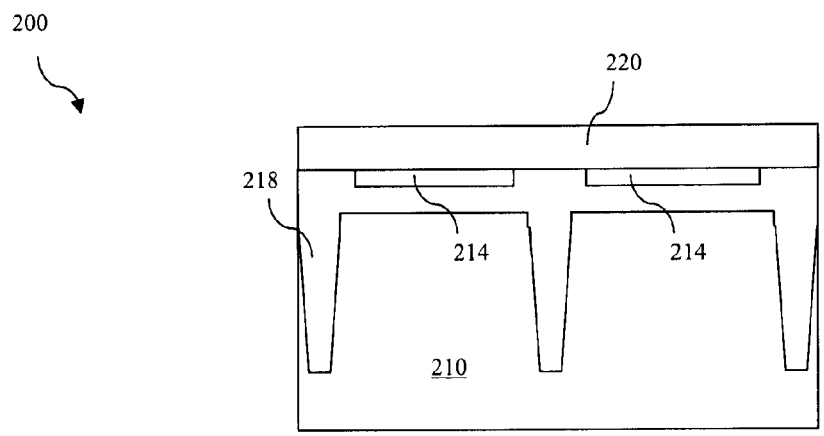

Referring to FIGS. 1 and 5, the method 100 proceeds to step 116 by forming a capping layer 220 on the semiconductor substrate covering the silicon nitride mask 214 and the trench isolation features 218. The capping layer 220 includes silicon nitride. In another embodiment, the capping layer 220 may include other suitable materials such as silicon oxide. In various embodiments, the capping layer 200 includes silicon nitride formed by a low pressure CVD (LPCVD), or a silicon nitride formed by a plasma enhanced CVD (PECVD), or tetraethyl orthosilicate formed by a CVD process, or a silicon oxide formed by a high aspect ratio process (HARP). The capping layer 220 includes a thickness of about 230 angstroms. In another embodiment, the capping layer 200 has a thickness ranging between about 100 angstroms and about 1000 angstroms.

Still referring to FIGS. 1 and 5, the method 100 proceeds to step 118 by performing an annealing process to the semiconductor structure 200 after the capping layer is formed thereon. The annealing process is applied to the semiconductor substrate with the capping layer 220 for stress memorization. Thus, the stress-released state of the active region, after the ion implantation to the trench isolation features, will be substantially maintained. In one embodiment, the annealing process is implemented in a rapid thermal annealing (RTA) tool. In another embodiment, the annealing process is applied to the semiconductor structure 200 with an annealing temperature ranging between about 1000° C. and about 1050° C. In another embodiment, the annealing process is applied to the semiconductor structure 200 with an annealing duration ranging between about 5 seconds and about 30 seconds.

Figure 6:
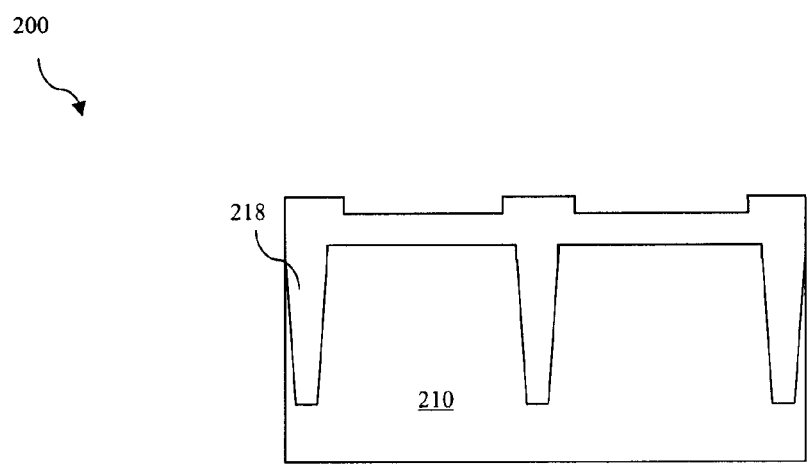

Referring to FIGS. 1 and 6, the method 100 proceeds to step 120 by removing the capping layer 220 and the silicon nitride mask 214 from the semiconductor structure 200. The etching process may include a wet etching or a dry etching process. In one example of the semiconductor structure with a silicon nitride capping layer and a silicon nitride mask layer, both the capping layer and the hard mask layer are removed by one etching process. For example, silicon nitride can be etched away by a phosphoric acid solution. In another example of the silicon oxide capping layer and the silicon nitride hard mask layer, the silicon oxide layer is etched away by a hydrofluoric acid (HF) or buffered HF and the silicon nitride layer is etched away by a phosphoric acid solution. In another example, the silicon oxide capping layer is removed by a CMP process and the silicon nitride mask layer is removed by a wet etching process using a phosphoric acid solution.

Although embodiments of the present disclosure have been described in detail, those skilled in the art should understand that they may make various changes, substitutions, and alterations herein without departing from the spirit and scope of the present disclosure. For example, the ion implantation process to the trench isolation features may be performed before the CMP process step 112. In another embodiment, another ion implantation process is additionally applied to the trench isolation features 218 to further release the stress built in the active regions.

Although not shown, other processing steps may present to form various doped regions, such as source and drain regions, and device features, such as gate stacks and multilayer interconnection (MLI). In one example, a gate feature is formed on the semiconductor substrate 210. The gate feature may include a gate dielectric, a gate electrode, a silicide contact layer, and gate spacers. The gate dielectric includes silicon oxide, silicon oxynitride, high-k material, or combinations thereof. The gate electrode may include doped polysilicon, metal, metal silicide, other conductive material, or combinations thereof. The silicide contact layer includes nickel silicide, cobalt silicide, tungsten silicide, tantalum silicide, titanium silicide, platinum silicide, erbium silicide, palladium silicide, or combinations thereof. The gate spacers may have a multilayer structure and may include silicon oxide, silicon nitride, silicon oxynitride, or other dielectric materials.

The semiconductor structure 200 also includes vertical interconnects, such as conventional vias or contacts, and horizontal interconnects, such as metal lines. The various interconnection features may implement various conductive materials including copper, tungsten, and silicide. In one example, a damascene process is used to form copper related multilayer interconnection structures. In another embodiment, tungsten is used to form tungsten plugs in the contact holes.

The semiconductor structure 200 further includes doped source and drain regions and light doped drain regions of either an n-type dopant or a p-type dopant formed by a conventional doping process such as ion implantation. N-type dopant impurities employed to form the doped regions may include phosphorus, arsenic, and/or other materials. P-type dopant impurities may include boron, indium, and/or other materials.

The present disclosure is not limited to applications in which the semiconductor structure 200 has a gate structure or a MOS transistor, and may be extended to any integrated circuit. For example, in other embodiments, the semiconductor structure 200 may include a memory device, a sensor device, and/or other microelectronic devices (collectively referred to herein as microelectronic devices). In another embodiment, the semiconductor structure 200 may include FinFET transistors. Of course, aspects of the present disclosure are also applicable and/or readily adaptable to any type of transistor, including single-gate transistors, double-gate transistors, and other multiple-gate transistors, and may be employed in many different applications, including sensor cells, memory cells, logic cells, and others.

The semiconductor structure 200 serves as only one example of a device within which various aspects of FIGS. 1-6 may be implemented. The semiconductor structure 200 and the method of making the same may be used in other semiconductor devices having high k and metal gate features, a strained semiconductor substrate, a hetero-semiconductor device, or a stress-free isolation structure.

Thus, the present disclosure provides a method of manufacturing a semiconductor structure. The method includes forming a hard mask pattern on a semiconductor substrate, wherein the hard mask pattern covers active regions; forming a trench in the semiconductor substrate within an opening defined by the hard mask pattern; filling the trench with a dielectric material, resulting in a trench isolation feature; performing an ion implantation to the trench isolation feature using the hard mask pattern to protect active regions of the semiconductor substrate; and removing the hard mask pattern after the performing of the ion implantation.

In the present disclosure, the performing of the ion implantation may include implanting germanium (Ge). The performing of the ion implantation may include implanting a species selected from the group consisting of Si, N, Ar, F, and As. The forming of the hard mask pattern may include forming a silicon nitride layer. The forming of the hard mask pattern may further include patterning the silicon nitride layer. The disclosed method may further include performing a thermal process to the semiconductor substrate after the performing of the ion implantation. The performing of the thermal process may include performing an annealing process with an annealing temperature ranging between about 1000° C. and about 1050° C. The disclosed method may further include forming a capping film on the semiconductor substrate after the performing of the ion implantation and before the performing of the thermal process. The forming of the capping film may include forming a dielectric material selected from the group consisting of low pressure chemical vapor deposition silicon nitride (LPSiN), plasma enhance chemical vapor deposition silicon nitride (PESiN), and tetraethyl orthosilicate (TEOS) and silicon oxide by high aspect ratio process (HARP oxide). The disclosed method may further include removing the hard mask pattern after the performing of the ion implantation.

The present disclosure also provides another embodiment of a method of manufacturing a semiconductor structure. The method includes forming a thermal silicon oxide layer on a semiconductor substrate; forming a silicon nitride layer on the thermal silicon oxide layer; patterning the silicon nitride layer and thermal silicon oxide layer to form silicon nitride mask defining openings exposing portions of the semiconductor substrate; forming trenches in the semiconductor substrate within the openings; filling the trenches with a dielectric material, resulting in shallow trench isolation (STI) features; performing an ion implantation to the STI features using the silicon nitride mask to protect active regions of the semiconductor substrate; thereafter forming a capping film on the semiconductor substrate; thereafter performing a thermal annealing process to the semiconductor substrate; and thereafter removing the capping film and the silicon nitride mask.

In the disclosed method, the performing of the ion implantation may include applying an implantation energy ranging between about 30 keV and about 80 keV and an implantation dose ranging between about $10^{14}$ cm$^{-2}$ and $10^{15}$ cm$^{-2}$. The disclosed method may further comprises a second ion implantation to the STI features after the removing of the capping film and the silicon nitride. The performing of the ion implantation may include implanting a species selected from the group consisting of Si, N, Ge, Ar, F, As, and combinations thereof. The performing of the thermal annealing process may include applying an annealing process of a temperature ranging between about 1000° C. and about 1050° C. and a processing duration ranging between about 5 seconds and about 30 seconds. The disclosed method may further include planarizing the semiconductor substrate after the filling of the trenches and before the performing of the ion implantation.

The present disclosure also provides another embodiment of a method of manufacturing a semiconductor structure. The method includes forming a shallow trench isolation feature having a dielectric material in a silicon substrate within an opening of a silicon nitride layer on the silicon substrate; ion implanting the STI feature using the silicon nitride layer as a hard mask to protect active regions of the silicon substrate; forming a capping film on the silicon substrate; annealing the STI; and removing the capping film and the silicon nitride layer.

In the disclosed method, the dielectric material of the STI may include a material selected from the group consisting of silicon oxide, silicon nitride, silicon oxynitride, and combinations thereof. The ion implanting may include implanting a species selected from the group consisting of Si, N, Ge, Ar, F, and As. The disclosed method may further include implanting silicon to the STI after the removing of the capping film and the silicon nitride layer.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a semiconductor structure, comprising:
    forming a hard mask pattern on a semiconductor substrate, wherein the hard mask pattern covers active regions;
    forming a trench in the semiconductor substrate within an opening defined by the hard mask pattern;
    filling the trench with a dielectric material, resulting in a trench isolation feature;
    performing an ion implantation to the trench isolation feature using the hard mask pattern to protect active regions of the semiconductor substrate;
    thereafter forming a capping film on the semiconductor substrate;
    thereafter performing a thermal process to the semiconductor substrate; and
    thereafter removing the hard mask pattern and the capping film.

2. The method of claim 1, wherein the performing of the ion implantation comprises implanting germanium (Ge).

3. The method of claim 1, wherein the performing of the ion implantation comprises implanting a species selected from the group consisting of Si, N, Ar, F, and As.

4. The method of claim 1, wherein the forming of the hard mask pattern comprises forming a silicon nitride layer.

5. The method of claim 4, wherein the forming of the hard mask pattern further comprises patterning the silicon nitride layer.

6. The method of claim 1, wherein the performing of the thermal process comprises performing an annealing process with an annealing temperature ranging between about 1000° C. and about 1050° C.

7. The method of claim 1, wherein the forming of the capping film comprises forming a dielectric material selected from the group consisting of low pressure chemical vapor deposition silicon nitride (LPSiN), plasma enhance chemical vapor deposition silicon nitride (PESiN), and tetraethyl orthosilicate (TEOS) and silicon oxide by high aspect ratio process (HARP oxide).

8. A method of manufacturing a semiconductor structure, comprising:
    forming a thermal silicon oxide layer on a semiconductor substrate;
    forming a silicon nitride layer on the thermal silicon oxide layer;
    patterning the silicon nitride layer and thermal silicon oxide layer to form silicon nitride mask defining openings exposing portions of the semiconductor substrate;
    forming trenches in the semiconductor substrate within the openings;
    filling the trenches with a dielectric material, resulting in shallow trench isolation (STI) features;
    performing an ion implantation to the STI features using the silicon nitride mask to protect active regions of the semiconductor substrate;
    thereafter forming a capping film on the semiconductor substrate;
    thereafter performing a thermal annealing process to the semiconductor substrate; and
    thereafter removing the capping film and the silicon nitride mask.

9. The method of claim 8, wherein the performing of the ion implantation comprises applying an implantation energy ranging between about 30 keV and about 80 keV and an implantation dose ranging between about $10^{14}$ cm$^{-2}$ and $10^{15}$ cm$^{-2}$.

10. The method of claim 8, further comprising a second ion implantation to the STI features after the removing of the capping film and the silicon nitride.

11. The method of claim 8, wherein the performing of the ion implantation comprises implanting a species selected from the group consisting of Si, N, Ge, Ar, F, As, and combinations thereof.

12. The method of claim 8, wherein the performing of the thermal annealing process comprises applying an annealing process of a temperature ranging between about 1000° C. and about 1050° C. and a processing duration ranging between about 5 seconds and about 30 seconds.

13. The method of claim 8, further comprising planarizing the semiconductor substrate after the filling of the trenches and before the performing of the ion implantation.

14. The method of claim 8, wherein the forming of the capping film comprises forming a dielectric material selected from the group consisting of low pressure chemical vapor deposition silicon nitride (LPSiN), plasma enhance chemical vapor deposition silicon nitride (PESiN), and tetraethyl orthosilicate (TEOS) and silicon oxide by high aspect ratio process (HARP oxide).

15. A method of manufacturing a semiconductor structure, comprising:
   forming a shallow trench isolation feature having a dielectric material in a silicon substrate within an opening of a silicon nitride layer on the silicon substrate;
   ion implanting the STI feature using the silicon nitride layer as a hard mask to protect active regions of the silicon substrate;
   forming a capping film on the silicon substrate;
   annealing the STI; and
   removing the capping film and the silicon nitride layer after the annealing.

16. The method of claim 15, wherein the dielectric material of the STI comprises a material selected from the group consisting of silicon oxide, silicon nitride, silicon oxynitride, and combinations thereof.

17. The method of claim 15, wherein the ion implanting comprises implanting a species selected from the group consisting of Si, N, Ge, Ar, F, and As.

18. The method of claim 15, further comprising implanting silicon to the STI after the removing of the capping film and the silicon nitride layer.

19. A method comprising:
   forming a trench isolation feature having a dielectric material in a semiconductor substrate within an opening of a hard mask layer on the semiconductor substrate;
   performing an ion implantation to the trench isolation feature, using the hard mask layer to protect portions of the semiconductor substrate;
   thereafter forming a capping film on the semiconductor substrate; and
   thereafter removing the hard mask layer and the capping film.

20. The method of claim 19, wherein the performing of the ion implantation comprises implanting a species selected from the group consisting of Ge, Si, N, Ar, F, and As.

21. The method of claim 19, further comprising performing a thermal process to the semiconductor substrate after the forming of a capping film on the semiconductor substrate and before the removing of the hard mask layer and the capping film.

* * * * *